United States Patent
Yamamura et al.

(10) Patent No.: US 10,240,239 B2
(45) Date of Patent: Mar. 26, 2019

(54) MANUFACTURING METHOD OF METAL COMPONENT AND MANUFACTURING METHOD OF ELECTRONIC APPARATUS

(71) Applicant: SEIKO EPSON CORPORATION, Tokyo (JP)

(72) Inventors: Tomoyoshi Yamamura, Sakata (JP); Hiroyuki Sugawara, Tsuruoka (JP); Satoru Nishimura, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/601,452

(22) Filed: May 22, 2017

(65) Prior Publication Data

US 2017/0362715 A1  Dec. 21, 2017

(30) Foreign Application Priority Data

Jun. 16, 2016 (JP) .................. 2016-119628

(51) Int. Cl.
| | |
|---|---|
| *C23F 1/02* | (2006.01) |
| *G03F 7/20* | (2006.01) |
| *G03F 7/40* | (2006.01) |
| *B32B 37/10* | (2006.01) |
| *C23F 1/18* | (2006.01) |
| *C23F 1/28* | (2006.01) |
| *G03F 7/00* | (2006.01) |
| *B32B 3/10* | (2006.01) |
| *G03F 7/004* | (2006.01) |
| *G03F 7/095* | (2006.01) |
| *B32B 38/10* | (2006.01) |

(52) U.S. Cl.
CPC ............... *C23F 1/02* (2013.01); *B32B 37/10* (2013.01); *G03F 7/2002* (2013.01); *G03F 7/40* (2013.01); *B32B 38/10* (2013.01); *C23F 1/18* (2013.01); *C23F 1/28* (2013.01); *G03F 7/0035* (2013.01); *G03F 7/0041* (2013.01); *G03F 7/095* (2013.01)

(58) Field of Classification Search
CPC ...... C23F 1/02; C23F 1/18; C23F 1/28; B32B 37/10; B32B 38/10; G03F 7/2002; G03F 7/40; G03F 7/0041; G03F 7/095
See application file for complete search history.

(56) References Cited

U.S. PATENT DOCUMENTS

| | | | |
|---|---|---|---|
| 5,560,726 A | 10/1996 | Kawaguchi | |
| 5,904,503 A * | 5/1999 | Frechette | H01L 21/4828 257/E23.039 |
| 2011/0056910 A1* | 3/2011 | Kato | C23F 1/18 216/41 |

FOREIGN PATENT DOCUMENTS

| | | |
|---|---|---|
| JP | H06-312866 A | 11/1994 |
| JP | 2009-006630 A | 1/2009 |

* cited by examiner

*Primary Examiner* — Anita K Alanko
(74) *Attorney, Agent, or Firm* — Oliff PLC

(57) ABSTRACT

This manufacturing method of a metal component enables precision processing of a corner portion, and the radius of curvature of a cog tip of a gear and the like can be made smaller than before. The manufacturing method of a metal component includes: (a) forming a mask film having, in plan view, a first side, a second side, and an extension portion that extends from a region between the first side and the second side on a metal film; and (b) forming a corner portion having, in plan view, a third side and a fourth side by etching the metal film.

6 Claims, 8 Drawing Sheets

MANUFACTURING METHOD OF METAL COMPONENT AND MANUFACTURING METHOD OF ELECTRONIC APPARATUS

BACKGROUND

1. Technical Field

The present invention relates to a manufacturing method of a metal component by etching, a manufacturing method of an electronic apparatus using such a metal component, and the like.

2. Related Art

A manufacturing method using double punch stamping is disclosed in JP-A-6-312866 as a method of manufacturing a sharp cog tip of a metal component such as a gear, for example. In the case of double punch stamping, a sheet metal is punched in two stages using two molds, and as a result, a cog tip can be processed to have an acute angle, and the radius of curvature R can be reduced.

Meanwhile, a metal component such as a gear can be formed through etching processing instead of stamping. In the case where a metal component is manufactured by performing wet etching on a metal film, there is a problem in that, even if corner portions of an etching mask are shaped to have an acute angle, the tips of cogs are rounded due to side-etching. In any case, a manufacturing method of a metal component that enables precision processing of a corner portion is required in order to further reduce the radius of curvature of cog tips of a gear and the like by making the cog tips have an acute angle.

Also, in the case where a metal component having a fine shape is manufactured in one stage of wet etching, a metal film is isotropically etched by wet etching, and as a result, the metal component is not processed to have edges that are perpendicular to a bottom surface, and is processed to have sloped edges. Therefore, if a metal component has a fine shape, the thickness of the fine portion decreases, and as a result, the strength thereof decreases.

SUMMARY

Some aspects of the invention relate to a manufacturing method of a metal component that enables precision processing of a corner portion. Also, some aspects of the invention relate to a manufacturing method of a metal component that can suppress a reduction in strength, even if the metal component has a fine shape. Furthermore, some aspects of the invention relate to a manufacturing method and the like of an electronic apparatus using such a metal component.

A manufacturing method of a metal component according to a first aspect of the invention includes: (a) forming a mask film having, in plan view, a first side, a second side, and an extension portion that extends from a region between the first side and the second side on a metal film; and (b) forming a corner portion having, in plan view, a third side and a fourth side by etching the metal film.

According to the first aspect of the invention, a mask film having an extension portion that extends from a region between a first side and a second side is formed on a metal film, and the metal film is etched, and as a result, rounding of a tip of a corner portion by side etching can be suppressed due to the extension portion of the mask film. As a result, precision processing of a corner portion is enabled, and the radius of curvature of cog tips of a gear and the like can be made smaller than before.

Here, the step (b) may include, along with forming the third side of the corner portion by etching the metal film in reference to the first side of the mask film, and forming the fourth side of the corner portion by etching the metal film in reference to the second side of the mask film, forming a tip of the corner portion by etching the metal film under the extension portion of the mask film. Accordingly, the tip shape of the corner portion can be defined so as to be continuous to the third and fourth sides of the corner portion.

Also, the tip of the corner portion desirably has a radius of curvature that is smaller than 0.03 mm. Accordingly, in a gear and the like that moves an object that comes in contact with the tip of the corner portion, a sufficient friction force can be obtained when the tip of the corner portion comes in contact with the object.

Furthermore, the step (b) may include forming a gear in which a plurality of corner portions are circumferentially arranged, and that is connected to another region of the metal film via a tie bar, and the extension portion of the mask film may have a width that is smaller than a width of the tie bar. Accordingly, in the etching step of the metal film, while reducing the radius of curvature of cog tips by making the cog tips of the gear to have an acute angle, the tie bar remains even if the metal film is side-etched.

In that described above, the extension portion of the mask film may have a first width at a first distance from end portions of the first and second sides, and a second width that is smaller than the first width at a second distance, from the end portions of the first and second sides, that is larger than the first distance. Accordingly, the shape of the extension portion of the mask film is made closer to the tip shape of the corner portion, and the time required to etch the metal film can be reduced.

The manufacturing method of a metal component according to the first aspect of the invention may further include bonding the metal film and a carrier tape prior to the step (a). Accordingly, even if the metal film is thin, the metal film can be processed without being damaged.

A manufacturing method of a metal component according to a second aspect of the invention includes: (a) forming a first mask film for exposing a first region of a metal film, on the metal film; (b) thinning the metal film in the first region by etching the metal film using the first mask film as a mask; (c) separating the first mask film from the metal film; (d) forming a second mask film, on the metal film, that covers a portion of the first region and exposes a second region within the first region, the second mask film including, in plan view, a first side, a second side, and an extension portion that extends from a region between the first side and the second side, in the first region; and (e) forming a corner portion including, in plan view, a third side and a fourth side by removing at least the metal film in the second region by etching the metal film using the second mask film as a mask.

The second aspect has an effect that, in addition to the effect according to the first aspect, even if the metal component has a fine shape, as a result of manufacturing a metal component in two stages of etching, the width of a sloped portion, which causes thinning of the fine portion of the metal component, can be reduced, and therefore, a reduction in strength can be suppressed compared with a case where the metal component is manufactured in one stage of etching.

A manufacturing method of an electronic apparatus according to a third aspect of the invention includes incorporating a metal component manufactured with the manufacturing method according to any of the above manufacturing methods. According to the third aspect of the invention, as a result of using a metal component such as a gear having a cog tip whose radius of curvature is small, a sufficient friction force can be obtained between the gear and paper that comes into contact with the cog tip, and therefore, an electronic apparatus in which paper feed precision is improved can be manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. However, the invention is not limited to the following description, and it can be easily understood by a person skilled in the art that various changes may be made to the form and the details of the invention without departing from the spirit and scope of the invention. Therefore, the invention is not to be construed as being limited to the following description of the embodiments.

First Embodiment

Figure 1:
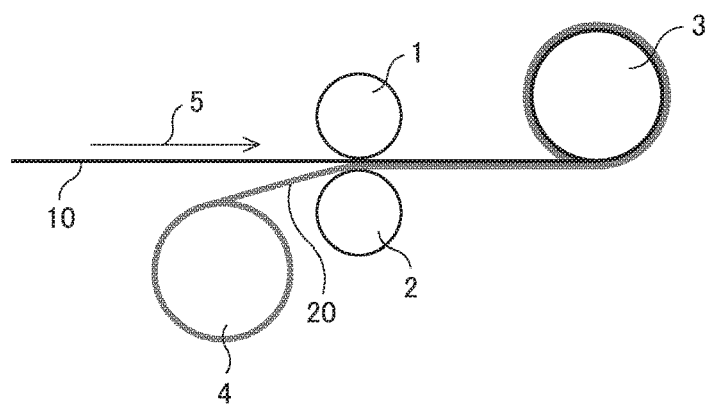
FIG. 1 is a diagram for describing a first step in a manufacturing method according to a first embodiment.

FIGS. 1 to 7 are diagrams for describing a manufacturing method of a metal component according to a first embodiment of the invention. FIG. 1 illustrates an overview of equipment used in a first step of the manufacturing method of a metal component according to the first embodiment. FIGS. 2 to 7 show cross sections of a portion in second to seventh steps in the manufacturing method of a metal component according to the first embodiment.

First, in the first step shown in FIG. 1, a metal film 10 and a carrier tape 20 are bonded. As a result of using the carrier tape 20 as a backing material, even if the metal film 10 is thin, the metal film 10 can be processed without damage. An SUS (stainless steel) material, a copper foil, or the like is used as the metal film 10, for example. Also, a flexible tape made of synthetic resin or the like is used as the carrier tape 20.

As shown in FIG. 1, the metal film 10 that is supplied from a supply reel (sot shown) passes between a first roller 1 and a second roller 2, and is wound around a take-up reel 3. Meanwhile, the carrier tape 20 that is supplied from a supply reel 4 is supplied between the first roller 1 and the second roller 2. Accordingly, the carrier tape 20 is bonded to the metal film 10 that is conveyed in a conveyance direction 5. Thereafter, a plurality of holes for exposure positioning are formed in the metal film 10 and the carrier tape 20 through stamping.

Figure 2:
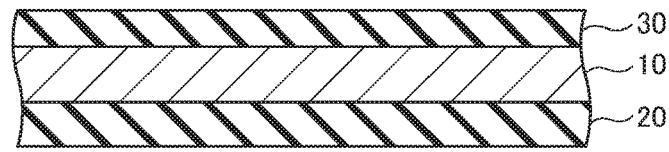
FIG. 2 is a diagram for describing a second step in the manufacturing method according to the first embodiment.
Figure 3:
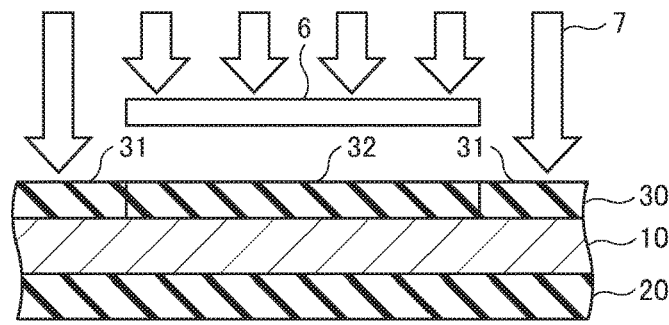
FIG. 3 is a diagram for describing a third step in the manufacturing method according to the first embodiment.

Next, as shown in FIG. 2, a resist solution is coated onto the metal film 10 and is baked, and as a result, a photoresist film 30 is formed on the metal film 10. Next, as shown in FIG. 3, the photoresist film 30 is irradiated with UV light 7 using a glass mask 6 as a mask. Accordingly, a portion 31 of the photoresist film 30 is irradiated with the UV light 7 and is exposed (exposed to light). Meanwhile, a portion 32 of the photoresist film 30 is not irradiated with the UV light 7, and is not exposed.

Figure 4:
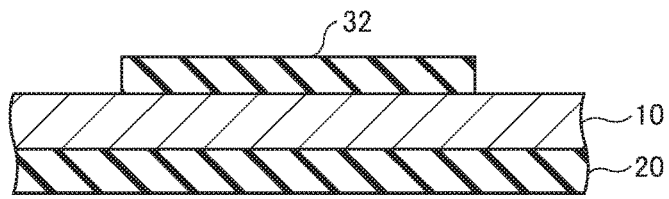
FIG. 4 is a diagram for describing a fourth step in the manufacturing method according to the first embodiment.

Next, as shown in FIG. 4, the photoresist film 30 is developed, and thereby the exposed portion 31 is removed, and the unexposed portion 32 remains on the metal film 10. Accordingly, the portion 32, of the photoresist film, having a predetermined pattern is formed on the metal film 10 as a mask film for causing a predetermined region of the metal film 10 to be exposed.

Figure 5:
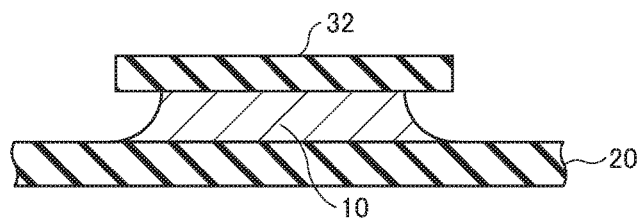
FIG. 5 is a diagram for describing a fifth step in the manufacturing method according to the first embodiment.

Next, as shown in FIG. 5, the metal film 10 is etched using the mask film 32 as a mask, and as a result, portions, of the metal film 10, that are not covered by the mask film 32 are removed. In the present embodiment, isotropic wet etching is performed as the etching. Therefore, portions of the metal film 10 that are located under the mask film 32 are removed due to side-etching. As a result, the shape of the metal component is determined by the metal film 10 that is not etched.

Figure 6:
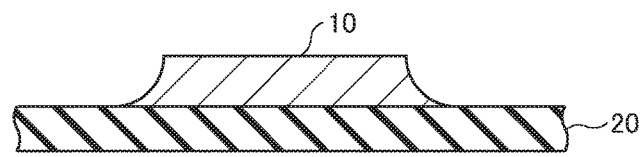
FIG. 6 is a diagram for describing a sixth step in the manufacturing method according to the first embodiment.
Figure 7:
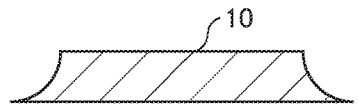
FIG. 7 is a diagram for describing a seventh step in the manufacturing method according to the first embodiment.

Next, as shown in FIG. 6 the mask film 32 is separated from the metal film 10. Next, as shown in FIG. 7, the carrier tape 20 is peeled off from the metal film 10, and as a result, a separate metal film 10 can be obtained. In this way, a metal component having a desired shape is manufactured. Thereafter, an inspection is performed to determine whether or not the metal component satisfies specifications.

Figure 8:
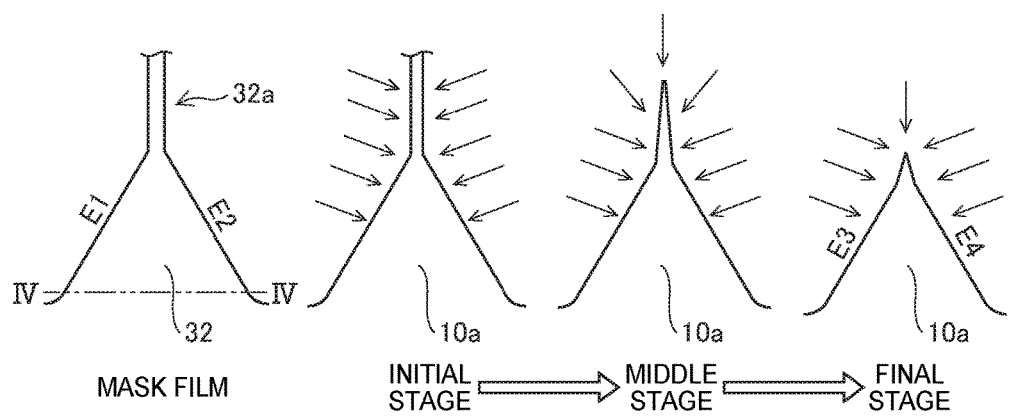
FIG. 8 is a plan view illustrating a mask film and a metal component in the manufacturing method according to the first embodiment.
Figure 9:
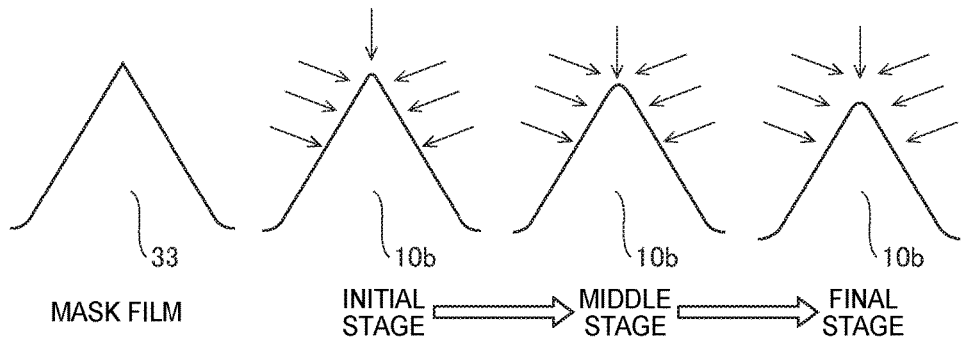
FIG. 9 is a plan view illustrating a mask film and a metal component in a comparative example.

FIG. 8 is a plan view illustrating shapes of a mask film and a metal component in the manufacturing method according to the first embodiment of the invention. FIG. 9 is a plan view illustrating shapes of a mask film and a metal component in a comparative example. FIGS. 8 and 9 each show a portion of a mask film for forming a gear, which is a metal component having a plurality of cogs (corner portions) that are circumferentially arranged, and an upper surface of one corner portion in the initial, middle, and final stage of etching using the mask film as a mask, as an example. Note that the two-dot chain line IV-IV shown in FIG. 8 indicates the position of the cross section of the mask film 32 in FIG. 4.

As shown in FIG. 8, the mask film 32 includes, in plan view, a first side (edge) E1, a second side E2, and an extension portion 32a that extends from a region between the first side E1 and the second side E2. In the present application, "in plan view" refers to viewing portions in a direction vertical to the bottom surface of the metal film 10 (FIG. 4) in a see-through manner. That is, the mask film 32 includes a bar-like dummy pattern at a tip corresponding to a cog tip of the gear. Such a mask film 32 is formed on the metal film 10, and the metal film 10 is etched (wet etched).

In the initial stage of etching, as a result of the etching progressing in reference to the shape of the mask film 32, the shape of a corner portion 10a becomes approximately the same as the shape of the mask film 32. In the middle stage of etching, the metal film 10 under the extension portion 32a of the mask film 32 is side-etched, and the shape of the tip (cog tip) of the corner portion 10a gradually approaches a desired shape.

In the final stage of etching, the corner portion 10a having a third side E3 and a fourth side E4 in plan view is formed. As a result of stopping the etching processing in a state in which the tip of the corner portion 10a is pointed, the tip of the corner portion 10a has an acute angle. Here, if the etching processing time is too short, the dummy pattern of the metal film 10 remains, and if the etching processing time is too long, the tip of the corner portion 10a is rounded. Therefore, it is necessary to appropriately set the etching processing time. That is, in order to cause the diameter of the gear to fall within a target range, it is important to appropriately combine the width of the extension portion 32a of the mask film 32 and the etching processing time.

In this way, the third side E3 of the corner portion 10a is formed by etching the metal film 10 in reference to the first side E1 of the mask film 32, and the fourth side E4 of the corner portion 10a is formed by etching the metal film 10 in reference to the second side E2 of the mask film 32. Along with this, the tip of the corner portion 10a is formed by etching the metal film 10 under the extension portion 32a of the mask film 32. Accordingly, the tip shape of the corner portion 10a can be defined so as to be continuous to the third side E3 and the fourth side E4 of the corner portion 10a.

According to the first embodiment, as a result of forming the mask film 32 having the extension portion 32a that extends from the region between the first side E1 and the second side E2 on the metal film 10, and etching the metal film 10, rounding of the tip of the corner portion 10a by side etching can be suppressed by the extension portion 32a of the mask film 32. As a result, precision processing of the corner portion 10a is enabled, and the radius of curvature of the cog tip of the gear can be made smaller than before.

Specifically, the radius of curvature of the tip of the corner portion 10a can be made smaller than 0.03 mm. For example, the tip of the corner portion 10a may have a radius of curvature smaller than 0.03 mm, or may have a radius of curvature less than or equal to 0.02 mm, or less than or equal to 0.015 mm. Accordingly, in a gear for moving an object that is in contact with the tip of the corner portion 10a, and the like, a sufficient friction force can be obtained when the tip of the corner portion 10a comes into contact with the object.

On the other hand, in FIG. 9, a case is shown in which a mask film 33 having no extension portion is used, as a comparative example. In the initial stage of etching, as a result of the etching progressing in reference to the shape of the mask film 33, the shape of a corner portion 10b becomes approximately the same as the shape of the mask film 33. At that time, the tip of the corner portion 10b is rounded by side etching, and the radius of curvature of the tip of the corner portion 10b increases compared with the radius of curvature of a tip of the mask film 33. In the middle and final stages of the etching as well, the tip of the corner portion 10b has a relatively large radius of curvature.

Specific Example of Gear

Figure 10:
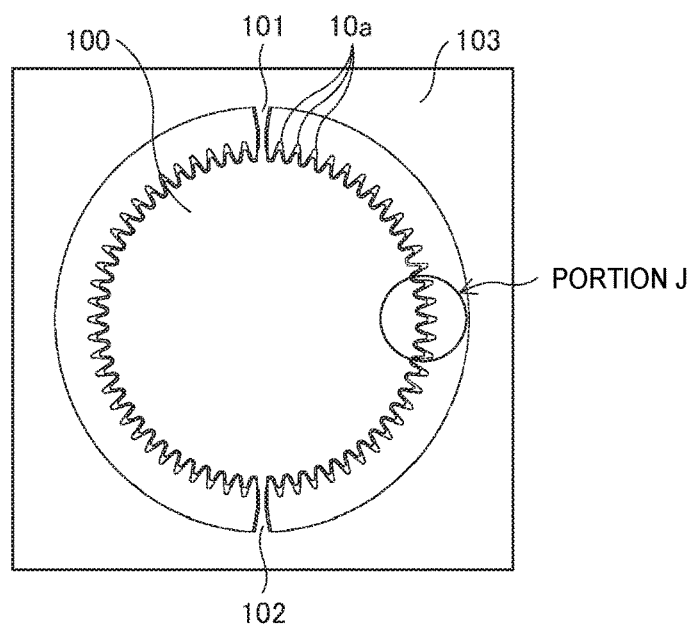
FIG. 10 is a plan view illustrating a gear manufactured by the manufacturing method according to the first embodiment.
Figure 11:
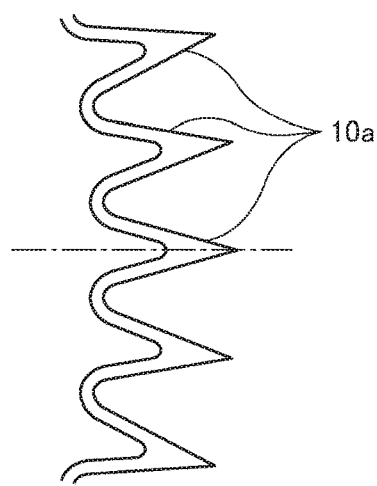
FIG. 11 is an enlarged plan view illustrating a J portion in FIG. 10.

FIG. 10 is a plan view illustrating a specific example of a gear manufactured by the manufacturing method of a metal component according to the first embodiment of the invention. FIG. 11 is an enlarged plan view illustrating a J portion in FIG. 10.

As shown in FIG. 10, a gear 100 has a shape in which a plurality of cogs (corner portions) 10a are circumferentially arranged, and is connected to another region 103 of the metal film via tie bars 101 and 102. In FIG. 10, two tie bars 101 and 102 are shown, as an example. By cutting these tie bars 101 and 102, a separate gear 100 can be obtained.

Specific Example of Mask Shape

Figure 12:
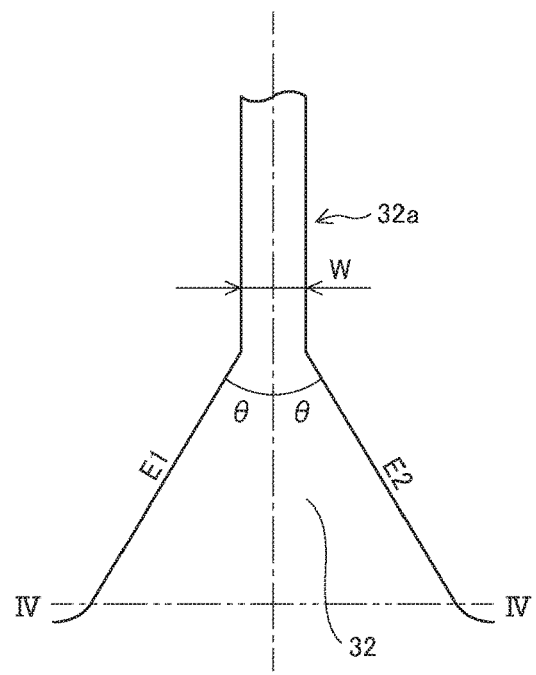
FIG. 12 is a plan view illustrating a shape of a mask film according to a first specific example.
Figure 13:
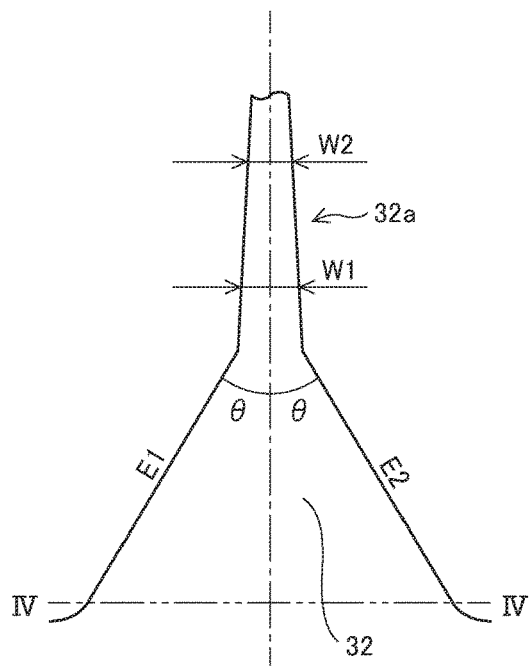
FIG. 13 is a plan view illustrating a shape of a mask film according to a second specific example.

FIG. 12 is a plan view illustrating a shape of a mask film according to a first specific example, and FIG. 13 is a plan view illustrating a shape of a mask film according to a second specific example. The mask film 32 shown in FIG. 12 or 13 is used to form the gear as shown in FIG. 10, for example. Note that the two-dot chain lines IV-IV shown in FIGS. 12 and 13 indicate the position of the cross section of the mask film 32 in FIG. 4.

The mask film 32 shown in FIG. 12 or 13 includes, in plan view, a first side E1, a second side E2, and an extension portion 32a that extends from a region between the first side E1 and the second side E2. The extension portion 32a extends on a side opposite to the center of the gear by a predetermined distance from end portions of the first side E1 and the second side E2 on a cog tip side. The center line (one dot chain line) of the extension portion 32a in a longitudinal direction desirably forms approximately equal angles θ (0°<θ<90°) with the first side E1 and the second side E2, and may pass through the center of the gear.

In the first specific example shown in FIG. 12, the extension portion 32a has a fixed width W. The width W of the extension portion 32a is desirably smaller than the width of the tie bars 101 and 102 (smallest width) shown in FIG. 10. Accordingly, in an etching step of the metal film, while the radius of curvature of the cog tip is reduced by making the cog tip of the gear to have an acute angle, the tie bars 101 and 102 remain even if the metal film is side-etched.

In the second specific example shown in FIG. 13, the extension portion 32a has a tapered shape. The width of the extension portion 32a changes along the center line of the extension portion 32a in a longitudinal direction. In this case, the extension portion 32a desirably has a first width W1 at a first distance from end portions of the first side E1 and the second side E2 on a cog tip side, and has a second width W2 that is smaller than the first width W1 at a second distance that is larger than the first distance from the end portions of the first side E1 and the second side E2 on the cog tip side. In this way, the shape of the extension portion 32a of the mask film 32 approaches that of a tip shape of the cog (corner portion), and the time required to etch the metal film can be reduced. In the second specific example as well, the first width W1 and the second width W2 of the extension portion 32a are desirably smaller than the width of the tie bars 101 and 102 shown in FIG. 10.

Second Embodiment

FIGS. 14 to 24 are diagrams for describing a manufacturing method of a metal component according to a second embodiment of the invention. FIGS. 14 to 24 show cross sections of a portion in second to twelfth steps in the manufacturing method of a metal component according to the second embodiment. In the second embodiment, etching of a metal film is performed in two stages. In other respects, the second embodiment is similar to the first embodiment, and redundant descriptions are omitted.

Figure 14:
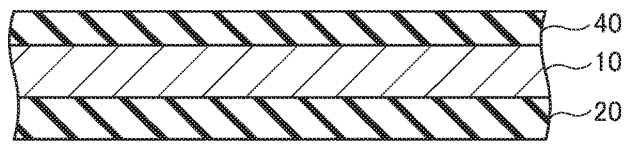
FIG. 14 is a diagram for describing a second step in a manufacturing method according to a second embodiment.

First, in a first step similar to that shown in FIG. 1, a metal film 10 and a carrier tape 20 are bonded. Next, as shown in FIG. 14, a resist solution is coated on the metal film 10 and is baked, and as a result, a first photoresist film 40 is formed on the metal film 10.

Figure 15:
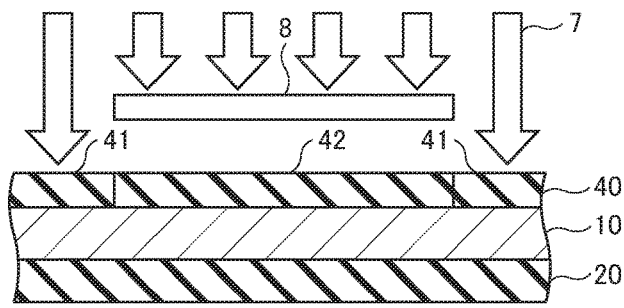
FIG. 15 is a diagram for describing a third step in the manufacturing method according to the second embodiment.

Next, as shown in FIG. 15, the first photoresist film 40 is irradiated with UV light 7 using a glass mask 8 as a mask. Accordingly, a portion 41 of the first photoresist film 40 is irradiated with the UV light 7 and is exposed. Meanwhile, a portion 42 of the first photoresist film 40 is not irradiated with the UV light 7, and is not exposed.

Figure 16:
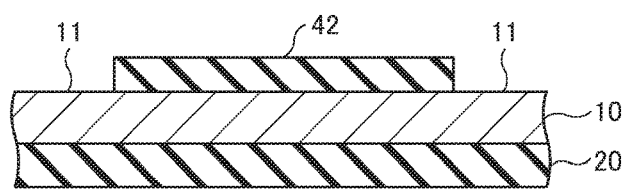
FIG. 16 is a diagram for describing a fourth step in the manufacturing method according to the second embodiment.

Next, as shown in FIG. 16, the first photoresist film 40 is developed, and thereby the exposed portion 41 is removed, and the unexposed portion 42 remains on the metal film 10. Accordingly, the portion 42, of the first photoresist film 41, having a predetermined pattern is formed on the metal film 10 as a first mask film for exposing a first region 11 of the metal film 10.

Figure 17:
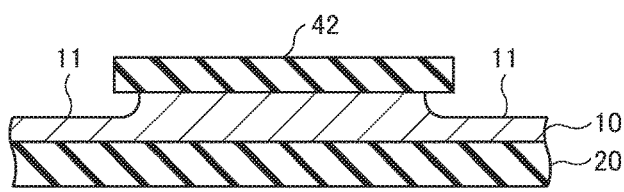
FIG. 17 is a diagram for describing a fifth step in the manufacturing method according to the second embodiment.

Next, as shown in FIG. 17, processing to make the metal film 10 thin in the first region 11 is performed by etching (wet etching) the first region 11 of the metal film 10 using the first mask film 42 as a mask. That is, the first region 11 of the metal film 10 is half-etched, using the first mask film 42 as a mask.

Figure 18:
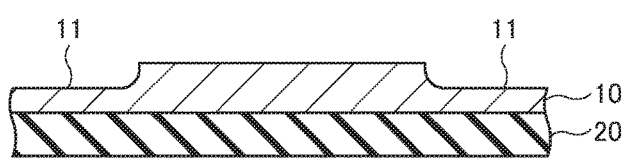
FIG. 18 is a diagram for describing a sixth step in the manufacturing method according to the second embodiment.
Figure 19:
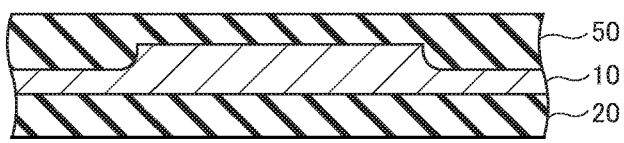
FIG. 19 is a diagram for describing a seventh step in the manufacturing method according to the second embodiment.

Next, as shown in FIG. 18, the first mask film 42 is separated from the metal film 10. Next, as shown in FIG. 19, a resist solution is coated on the metal film 10 including the first region 11, and is baked, and as a result, a second photoresist film 50 is formed on the metal film 10 including the first region 11.

Here, even if level differences are formed in the metal film 10 as a result of the first region 11 of the metal film 10 being half-etched, the thickness of the second photoresist film 50 is increased so as to sufficiently cover the level difference portions. As a result, the level difference portions are not unnecessarily etched in a later etching step.

Figure 20:
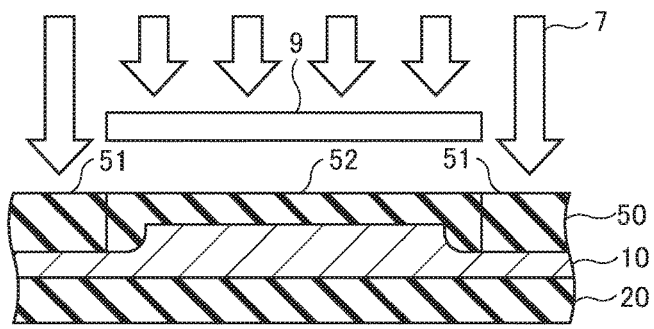
FIG. 20 is a diagram for describing an eighth step in the manufacturing method according to the second embodiment.

Next, as shown in FIG. 20, the second photoresist film 50 is irradiated with the UV light 7 using a glass mask 9 as a mask. Accordingly, a portion 51 of the second photoresist film 50 is irradiated with the UV light 7 and is exposed. Meanwhile, a portion 52 of the second photoresist film 50 is not irradiated with the UV light 7, and is not exposed.

Figure 21:
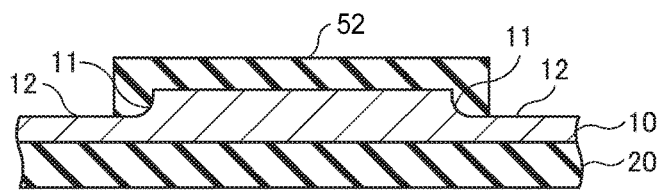
FIG. 21 is a diagram for describing a ninth step in the manufacturing method according to the second embodiment.

Next, as shown in FIG. 21, the second photoresist film 50 is developed, and thereby the exposed portion 51 is removed. Accordingly, the portion 52, of the second photoresist film 50, having a predetermined pattern is formed on the metal film 10 as a second mask film for covering a portion of the first region 11 of the metal film 10 and exposing a second region 12 within the first region 11.

Figure 22:
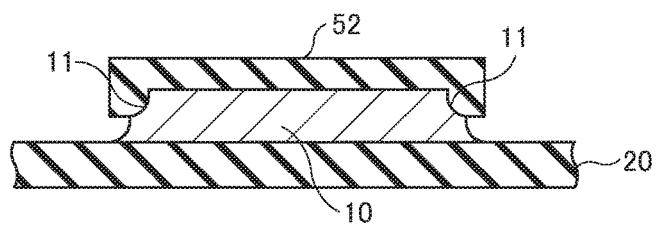
FIG. 22 is a diagram for describing a tenth step in the manufacturing method according to the second embodiment.

Next, as shown in FIG. 22, the second region 12 of the metal film 10 is etched (wet etched) using the second mask film 52 as a mask, and as a result, the metal film 10 in the second region 12 is removed. At that time, a portion of the metal film 10 located under the second mask film 52 is removed by side etching.

Figure 23:
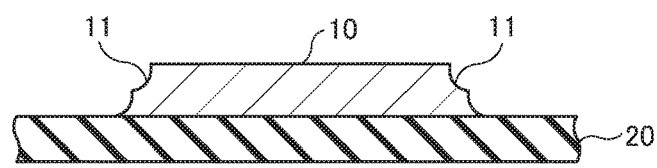
FIG. 23 is a diagram for describing an eleventh step in the manufacturing method according to the second embodiment.
Figure 24:
FIG. 24 is a diagram for describing a twelfth step in the manufacturing method according to the second embodiment.

Next, as shown in FIG. 23, the second mask film 52 is separated from the metal film 10. Next, as shown in FIG. 24, the carrier tape 20 is peeled off from the metal film 10, and as a result, a separate metal film 10 can be obtained. In this way, a metal component that has a portion of the first region 11 that is half etched and has a reduced thickness, and that results from the second region 12 being removed by etching, is manufactured.

Specific Example of Mask Shape

Figure 25:
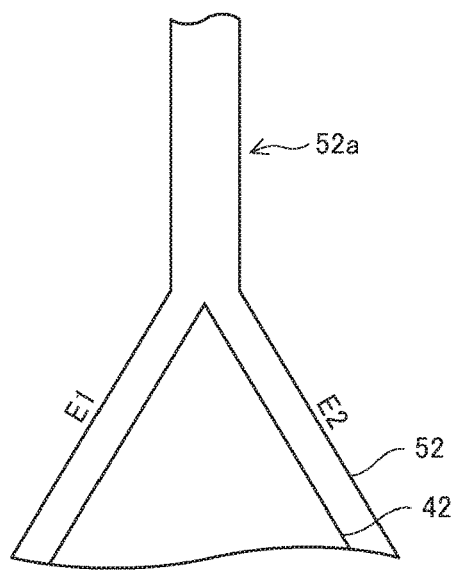
FIG. 25 is a plan view illustrating a shape of a mask film in the manufacturing method according to the second embodiment.

FIG. 25 is a plan view illustrating a specific example of shapes of the first and second mask films in the manufacturing method according to the second embodiment of the invention. In FIG. 25, portions of the first mask film 42 and the second mask film 52 that are used for forming a gear are shown such that the mask films are aligned relative to the metal film 10, as an example.

The second mask film 52 corresponds to the mask film 32 in the first embodiment shown in FIG. 8 and the like. In the first region 11 (FIG. 21), of the metal film 10, whose thickness is reduced by etching using the first mask film 42 as a mask, the second mask film 52 includes, in plan view, a first side E1, a second side E2, and an extension portion 52a that extends from a region between the first side E1 and the second side E2.

As a result of etching (wet etching) the metal film 10 using such a second mask film 52 as a mask, at least the metal film 10 in the second region 12 (FIG. 21) is removed, and a corner portion 10a having a third side E3 and a fourth side E4 in plan view is formed, as shown in FIG. 8.

The second embodiment has an effect that, in addition to the effect according to the first embodiment, as a result of manufacturing a metal component in two stages of etching, a reduction in strength can be suppressed even if the metal component has a fine shape, compared with a case where the metal component is manufactured in one stage of etching.

That is, after the thickness of the metal film 10 in the first region 11 is reduced in a half-etching step shown in FIG. 17, the metal film 10 in the second region 12 within the first region 11 is removed in an etching step shown in FIG. 22. Therefore, the width of a sloped portion at an edge of the metal component can be reduced compared with a case of one-stage of etching. As a result, even if a metal component has a fine shape, the sloped portion, which causes a reduction in the thickness of the fine portion of the metal component, is reduced, and therefore, a reduction in the strength of the metal component can be suppressed.

Specific Example of Gear

Figure 26:
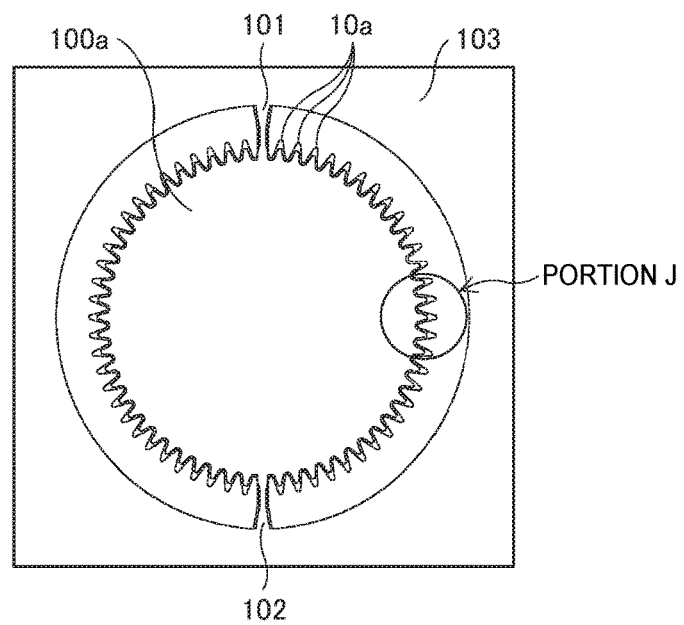
FIG. 26 is a plan view illustrating a gear manufactured by the manufacturing method according to the second embodiment.
Figure 27:
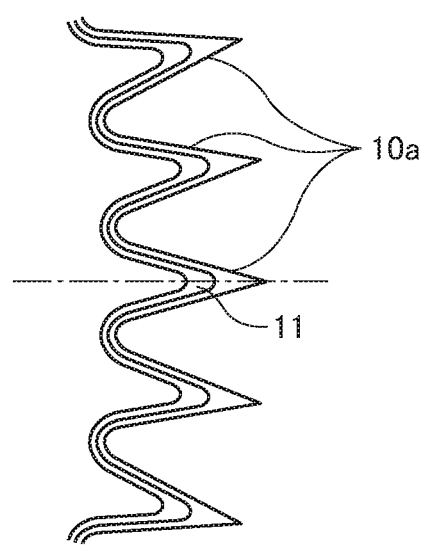
FIG. 27 is an enlarged plan view illustrating a J portion in FIG. 26.

FIG. 26 is a plan view illustrating a specific example of a gear manufactured by the manufacturing method of a metal component according to the second embodiment of the invention. FIG. 27 is an enlarged plan view illustrating a J portion in FIG. 26. In the case of manufacturing a gear 100a with the manufacturing method of a metal component according to the second embodiment of the invention, it is preferable that the first region 11 that is half-etched and has a thin thickness is located on a tip side of the cog (corner portion) 10a, as shown in FIG. 27.

In the above embodiments, a case where one aspect of the invention is applied to a gear was described, but one aspect of the invention can be applied to other metal components.

Manufacturing Method of Electronic Apparatus

A manufacturing method of an electronic apparatus according to one embodiment of the invention includes incorporating a metal component manufactured with the manufacturing method according to any of the embodiments of the invention into a casing of an electronic apparatus. A printer, which is an information output device to be connected to a computer or the like, a sheet discharge device installed to a copier or a facsimile machine, or the like corresponds to the electronic apparatus, for example. According to the manufacturing method of an electronic apparatus according to one embodiment of the invention, as a result of using a metal component such as a gear having a cog tip whose radius of curvature is small, a sufficient friction force can be obtained between the gear and paper that comes into contact with the cog tip, and therefore, an electronic apparatus in which paper feed precision is improved can be manufactured.

The entire disclosure of Japanese Patent Application No. 2016-119628, filed Jun. 16, 2016 is expressly incorporated by reference herein.

What is claimed is:

1. A manufacturing method of a metal component, comprising;
    (a) forming a first mask film for exposing a first region of a metal film, on the metal film;
    (b) thinning the metal film in the first region by etching the metal film using the first mask film as a mask;
    (c) separating the first mask film from the metal film;
    (d) forming a second mask film, on the metal film, that covers a portion of the first region and exposes a second region within the first region, the second mask film including, in plan view, a first side, a second side, and an extension portion that extends from a region between the first side and the second side, in the first region; and
    (e) forming a corner portion including, in plan view, a third side and a fourth side by removing at least the metal film in the second region by etching the metal film using the second mask film as a mask.

2. The manufacturing method according to claim 1, wherein the tip of the corner portion has a radius of curvature that is smaller than 0.03 mm.

3. The manufacturing method according to claim 1,
    wherein the step (d) includes forming a gear in which a plurality of corner portions are circumferentially arranged, and that is connected to another region of the metal film via a tie bar, and
    the extension portion of the mask film has a width that is smaller than a width of the tie bar.

4. The manufacturing method according to claim 1,
    wherein the extension portion of the mask film has a first width at a first distance from end portions of the first and second sides, and a second width that is smaller than the first width at a second distance, from the end portions of the first and second sides, that is larger than the first distance.

5. The manufacturing method according to claim 1, further comprising bonding the metal film and a carrier tape prior to the step (a).

6. A manufacturing method of an electronic apparatus, comprising:
    incorporating a metal component manufactured with the manufacturing method according to claim 1.

* * * * *